United States Patent [19]

Nishi et al.

[11] Patent Number: 5,370,142
[45] Date of Patent: Dec. 6, 1994

[54] SUBSTRATE WASHING DEVICE

[75] Inventors: Mitsuo Nishi, Kurume; Takanori Miyazaki, Kumamoto; Eiichi Mukai, Kurume; Yuuji Kamikawa, Uto; Hiroshi Tanaka, Kurume, all of Japan

[73] Assignees: Tokyo Electron Limited; Tokyo Electron Kyushu Limited, both of Japan

[21] Appl. No.: 149,635

[22] Filed: Nov. 9, 1993

[30] Foreign Application Priority Data

Nov. 10, 1992 [JP] Japan ................ 4-324946
Jan. 29, 1993 [JP] Japan ................ 5-32514

[51] Int. Cl.5 .............................. B08B 3/04
[52] U.S. Cl. ................................ 134/61; 118/500; 134/186; 134/201; 134/902; 206/334; 206/454; 211/41
[58] Field of Search ............... 134/902, 61, 186, 201; 211/41; 118/500; 206/334, 454

[56] References Cited

U.S. PATENT DOCUMENTS

| | | | |
|---|---|---|---|
| 4,653,636 | 3/1987 | Armstrong | 211/41 X |
| 4,728,246 | 3/1988 | Mello | 118/500 X |
| 5,213,118 | 5/1993 | Kamikawa | 134/902 X |
| 5,226,437 | 7/1993 | Kamikawa et al. | 134/902 X |
| 5,301,700 | 4/1994 | Kamikawa et al. | 134/902 X |

FOREIGN PATENT DOCUMENTS

| | | | |
|---|---|---|---|
| 61-48258 | 10/1986 | Japan . | |
| 130724 | 5/1992 | Japan | 134/902 |
| 304652 | 10/1992 | Japan | 118/500 |

*Primary Examiner*—Philip R. Coe
*Attorney, Agent, or Firm*—Graham & James

[57] ABSTRACT

A substrates-cleaning apparatus comprising process vessels in which washing solutions are contained, a chuck mechanism having a first substrate holder section for carrying silicon wafers to the process vessels while holding them in it, and a boat mechanism having a second substrate holder section for receiving the wafers from the chuck mechanism and for supporting the wafers in the washing solutions, wherein said second substrate holder section comprises base members made of erosion and heat resistant material, and receiver members attached to the base members, having a plurality of substrate holding grooves thereon, and made of erosion and heat resistant synthetic resin substantially same in softness as or softer than the wafers.

15 Claims, 15 Drawing Sheets

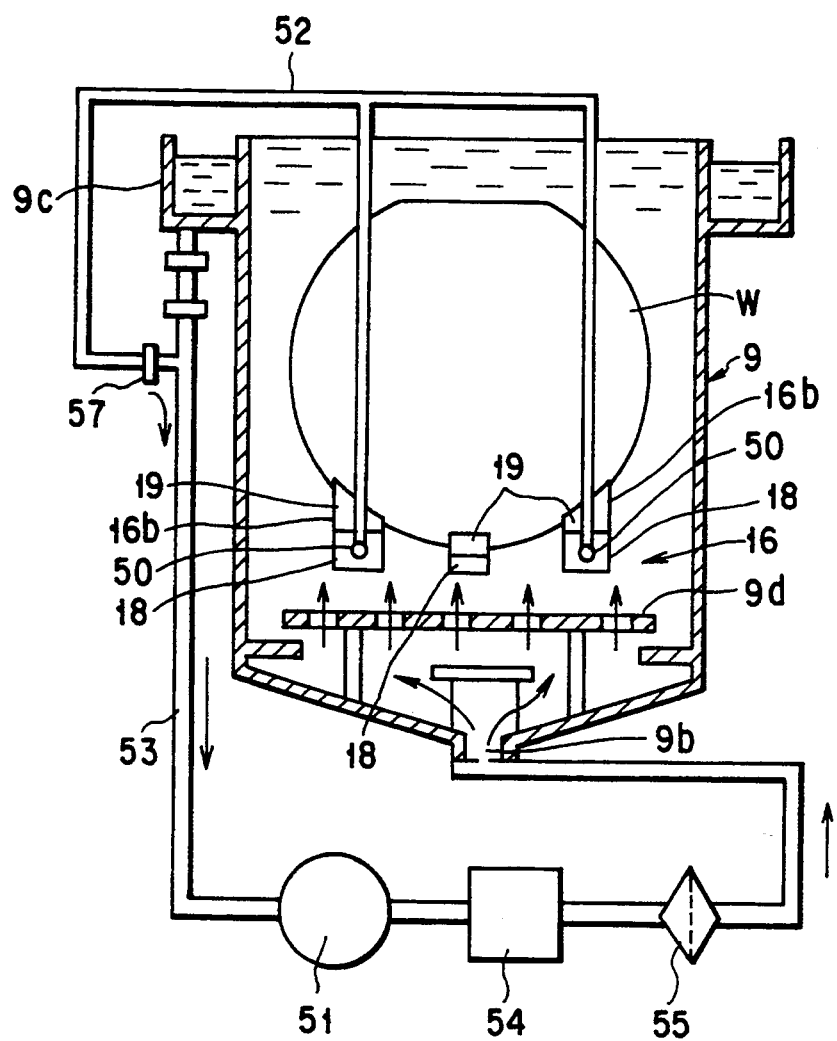
F I G. 2

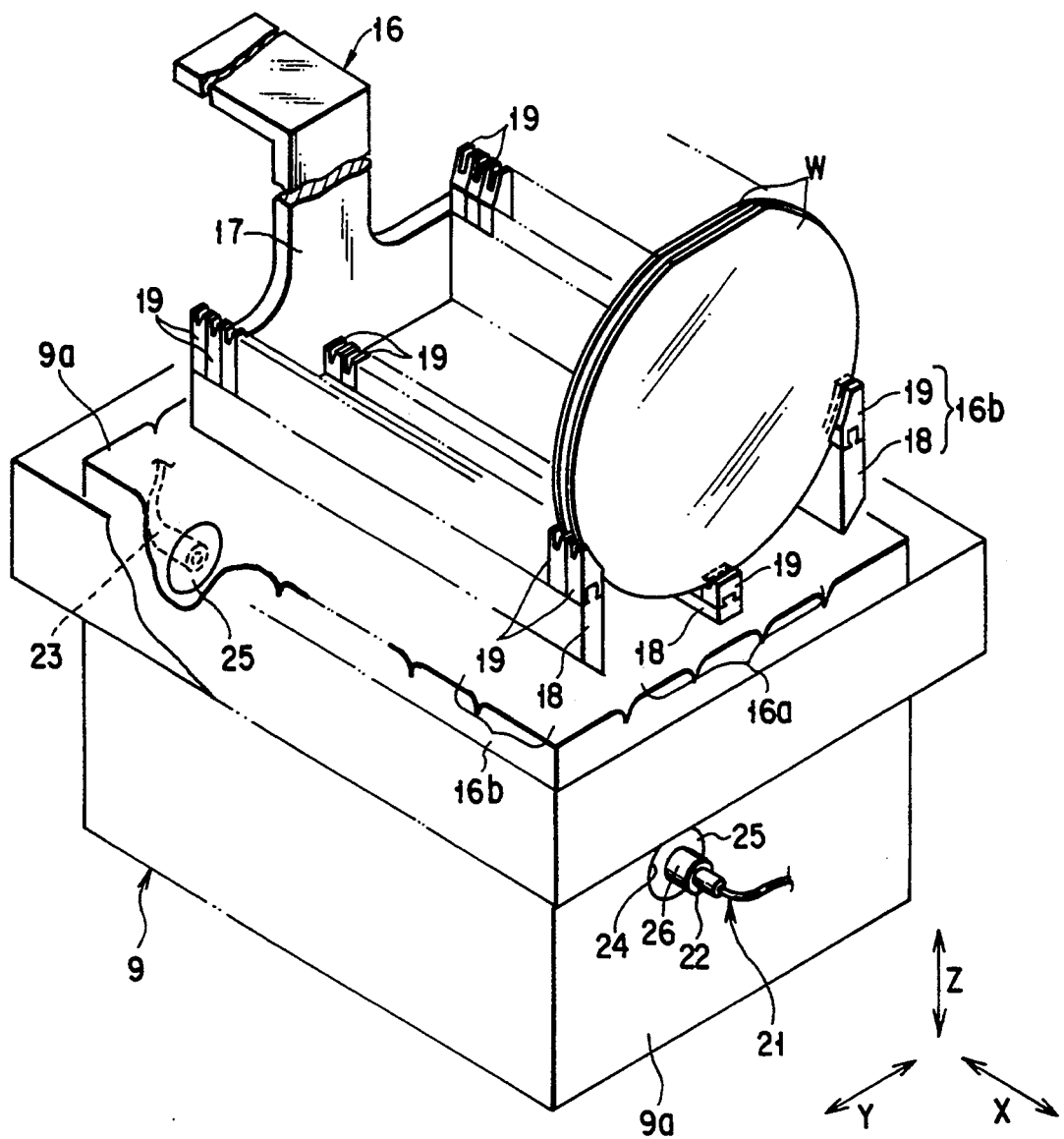
F I G. 4

SUBSTRATE WASHING DEVICE

BACKGROUND OF THE INVENTION

1. Field of the Invention

The present invention relates to a substrate washing device for washing substrates such as semiconductor wafers while immersing them in process solutions.

2. Description of the Related Art

A washing system includes plural solution vessels and wafer transfer mechanisms and it serves to clean the surface of each of the wafers while immersing them in ammonia and fluorine acid solutions and pure water. Each of the wafer transfer mechanisms has wafer chucks and a wafer boat, which have their wafer holder sections each having a plurality of wafer holding grooves formed thereon.

The wafer holder sections must be erosion-resistant because they are immersed in various chemical (or process) solutions together with the wafers. The wafer holder section, particularly, of the wafer boat must be made of material excellent in erosion and heat resistances and high in strength because it is immersed in high temperature solution (or sulfuric acid solution higher than 100° C., for example). It is therefore made of quartz.

When the wafers are transferred between the wafer chucks and the wafer boat, however, chipping is caused at those areas of the quartz-made wafer holder section which are contacted directly with the wafers. Particles are thus caused by this chipping and they adhere to the surface of each of the wafers. The efficiency of washing the wafers is thus lowered. Further, when the wafers collide with the wafer holder section while being carried, they themselves are damaged.

SUMMARY OF THE INVENTION

The object of the present invention is therefore to provide a substrate washing device capable of washing substrates at a higher efficiency but without causing any chipping at substrate holder sections and damaging the substrates.

According to an aspect of the present invention, there can be provided a substrate washing device comprising process vessels in which washing solutions are contained; chuck means having a first substrate holder section for carrying substrate made of a first material to the process vessels while holding the substrate; boat means having a second substrate holder section for receiving the substrate from the chuck means and for supporting the substrate in the washing solutions; wherein said second substrate holder section includes base members made of erosion and heat resistant material, and receiver members attached to the base members, having a plurality of substrate holding grooves thereon, and made of a second material substantially same in softness as or softer than the first material.

It is supposed that all of the wafer holder sections are made of synthetic resin. However, synthetic resin is poorer in heat resistance and strength than quartz. Members by which the substrate holder section is formed are therefore more easily deformed by heat. The substrates held by the substrate holder section is thus made unstable and the efficiency of processing the substrates is lowered accordingly. It is therefore desirable that those areas of the substrate holding members which are contacted directly with the substrates are made of synthetic resin and that the others thereof are made of quartz. It is also desirable in this case that the directly-contacted areas can be detached from the substrate holding members.

It is preferable that exhaust passages are formed, communicating with grooves on the substrate holding members, and that they are connected to a sucking or discharging means arranged outside the process vessel. A sucking pump is used as sucking means and a discharging pump is used as discharging means. When a pump for circulating and supplying process solution into the process vessel is used as sucking and discharging one in this case, the substrates-cleaning apparatus can be smaller-sized.

For the purpose of allowing the pitch of grooves to be made equal to that of substrates by thermal expansion when the substrate holding members are immersed in process solution, it is desirable that the pitch of grooves is previously made smaller than that of substrates under room temperature.

When the exhaust passages are formed to open in the grooves on the receiver members, that area of each of the substrates which is contacted with each of the substrate holder sections can be made smaller. In addition, process solution can be caused to more fluently flow at the substrate holder sections and particles can be thus more reliably removed from the surface of each of the substrates.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given adove and the detailed description of the preferred embodiments given below, serve to explain the principles of the invention.

FIG. 2 is a perspective view showing the solution circulation of a wafer-cleaning apparatus;

FIG. 4 is a perspective view showing a solution vessel and a wafer boat of the wafers-cleaning apparatus;

DETAILED DESCRIPTION OF THE PREFERRED EMBODIMENTS

The present invention will be described, citing some cases where it is used to clean semiconductor wafers and referring to the accompanying drawings.

Figure 1:
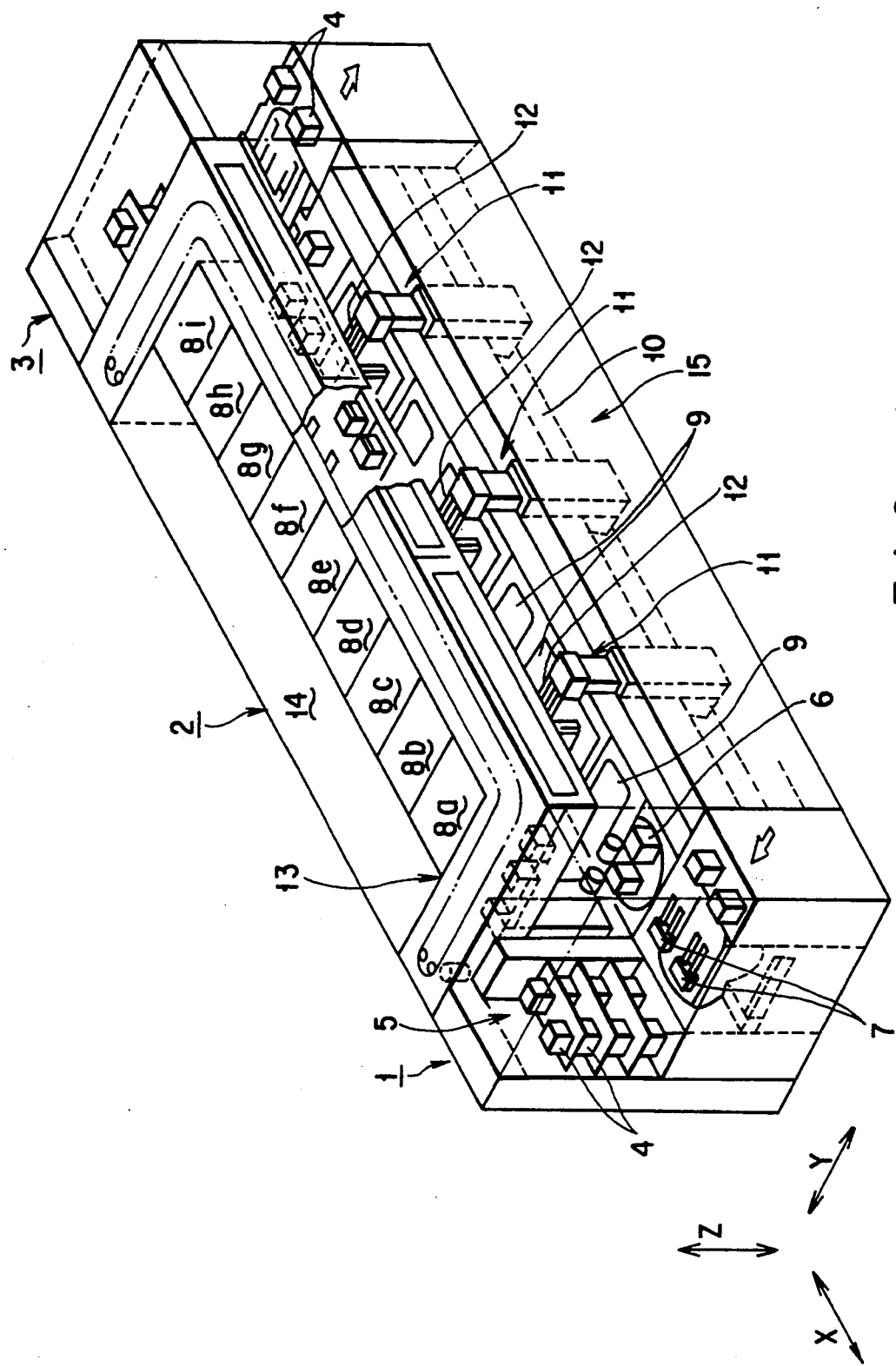
FIG. 1 is a perspective view schematically showing the whole of a cleaning system.

As shown in FIG. 1, the washing system includes loading, cleaning and unloading areas 1, 2 and 3. Wafers W which are not processed yet are carried into the system through the loading area 1. After washed at the washing area 2, they are carried outside the system through the unloading area 3.

The loading area 1 includes a waiting section 5, loader section 6 and cassette-carrying arms 7. A plurality of wafer cassettes 4 are stocked in the waiting section 5. The loader section 6 includes a wafer pickup mechanism (not shown), a pre-alignment mechanism (not shown) and a wafer counter (not shown). The wafer pickup mechanism serves to pick up wafers out of the cassette 4, the pre-alignment mechanism to align orientation flats of the wafers W in a desired direction, and the wafer counter to count the number of the wafers W. The cassettes-carrying arms 7 serve to transfer the cassettes 4 between the waiting 5 and the loader section 6.

The washing area 2 is arranged between the loading area 1 and the unloading area 3. Chuck-washing and -drying, solution-processing and water-washing chambers 8a, 8b and 8c; second water-washing and solution-processing chambers 8d and 8e; a third water-washing chamber 8f; a fourth water-washing chamber 8g; and second chuck-washing and -drying and wafer-drying chambers 8h and 8i are arranged this order in series at the washing area 2. A process vessel 9 is arranged in each of these chambers 8a–8i. A wafer carrier mechanism 15 is arranged along one side (or front side) of the washing area 2. It has a guide section 10 and three wafers-carrying blocks 11. The three wafers-carrying blocks 11 can move along the guide section 10 in horizontal and vertical directions (or directions X and Z). Each of them has wafer chucks 12, by which plural wafers can be carried to each of the chambers 8a–8i.

Figure 14:
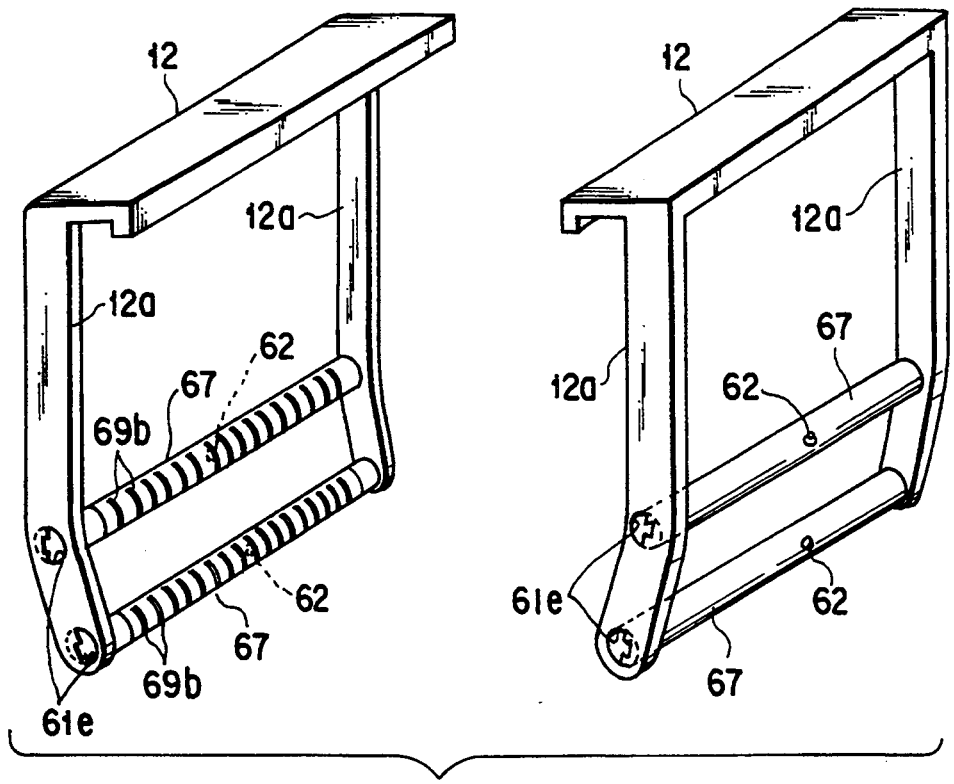
FIG. 14 is a perspective view showing wafer chuck members dismantled.
Figure 15:
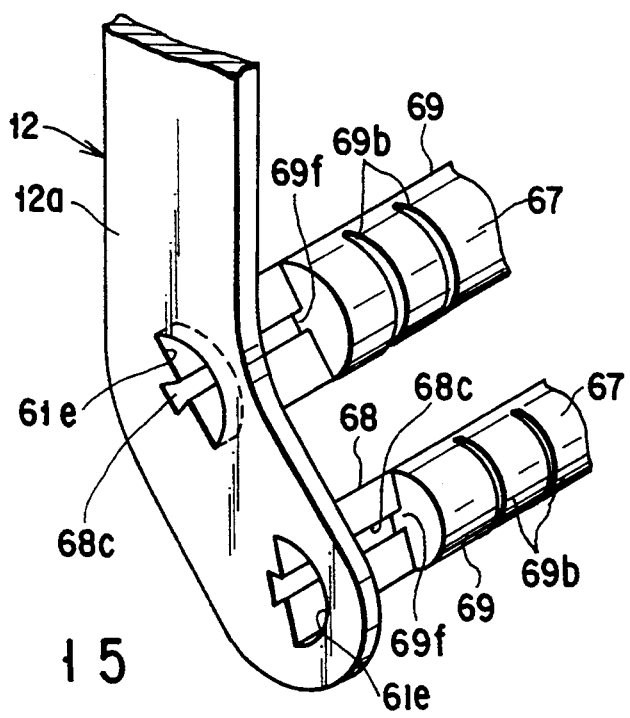
FIG. 15 is a perspective view showing a part of the wafer chuck member.
Figure 21:
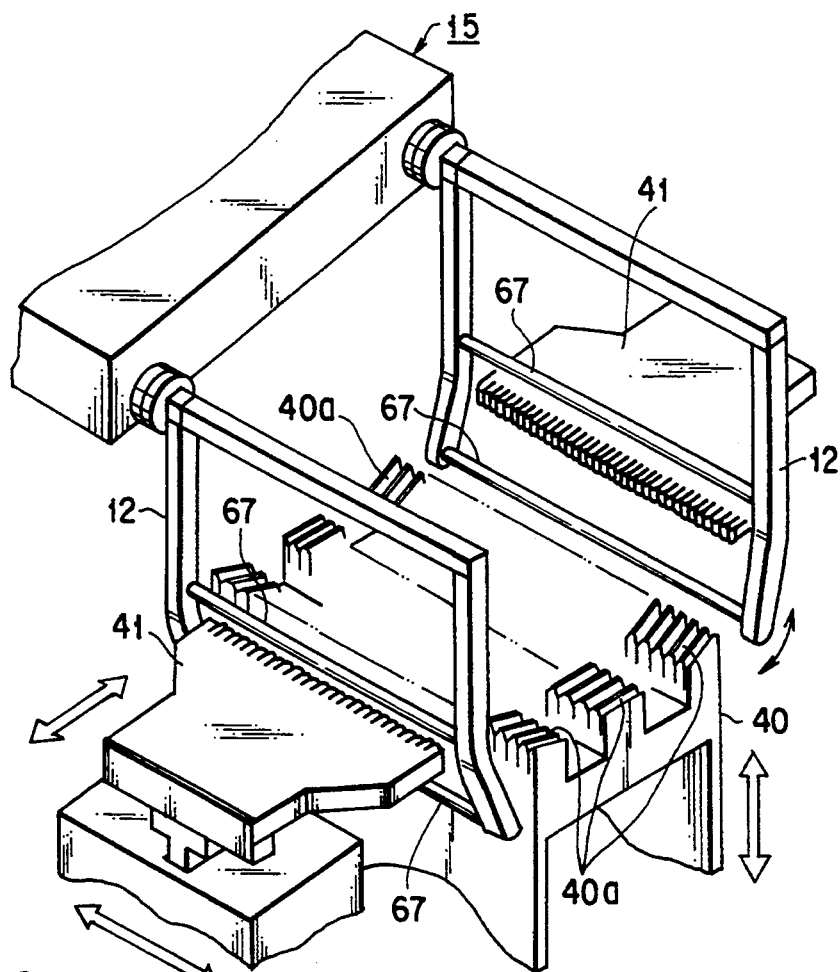
FIG. 21 is a perspective view showing wafer chuck and pusher mechanisms.

As shown in FIGS. 14, 15 and 21, four support rods 67 are attached to the wafer chucks 12 and wafer holding grooves 69b are formed on each of the rods 67 at a certain pitch interval. Wafers W are transferred from the wafer chucks 12 onto a wafer boat 16 in each of the chambers 8a–8i. A cassettes-carrying section 13 which serves to carry empty and wafers-filled cassettes 4 is arranged above the washing area 2. A room 14 in which solution tanks and pipe arrangements are housed is also arranged along the other side (or rear side) of the washing area 2.

Figure 3:
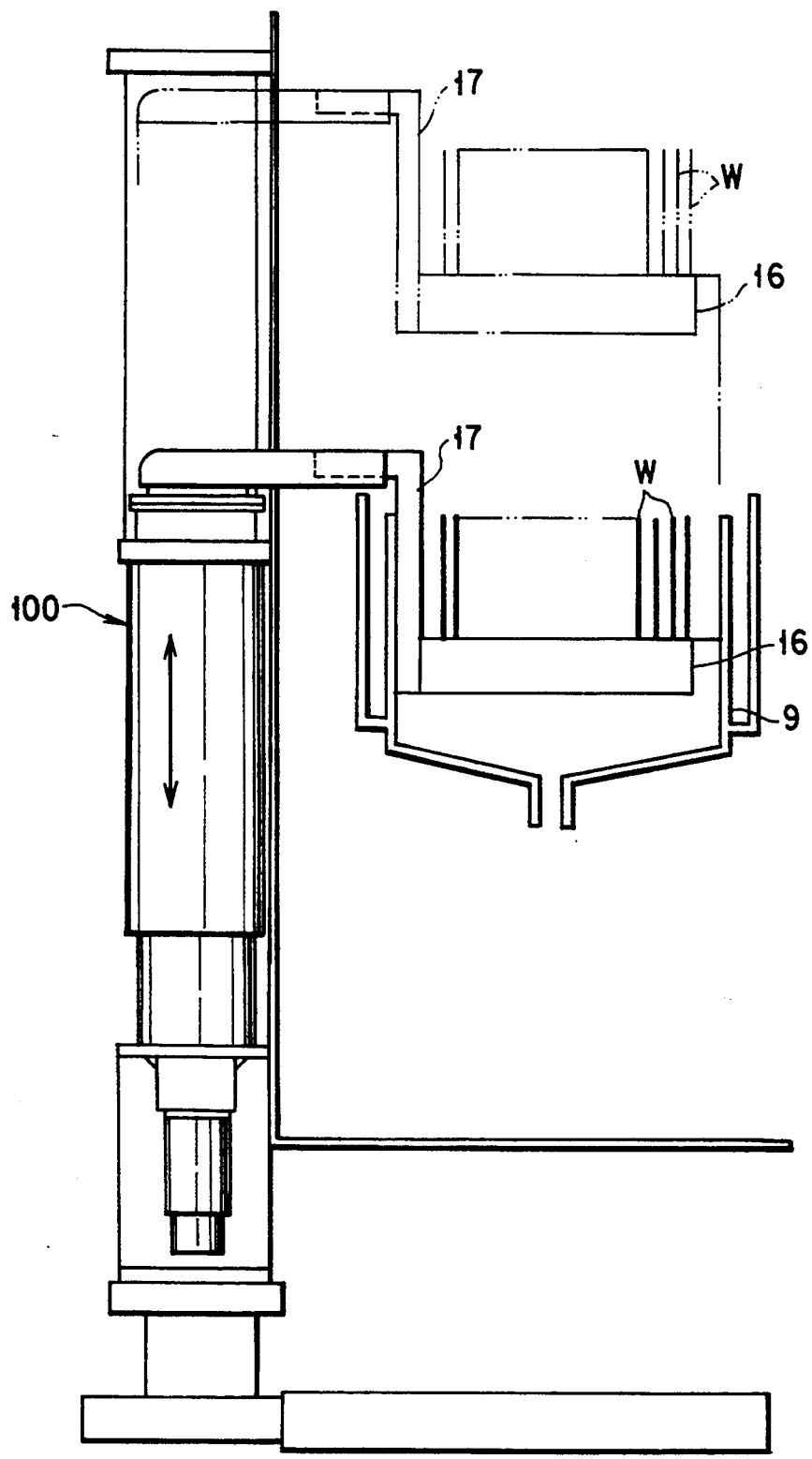
FIG. 3 is a view schematically showing a boat lifter means.
Figure 5:
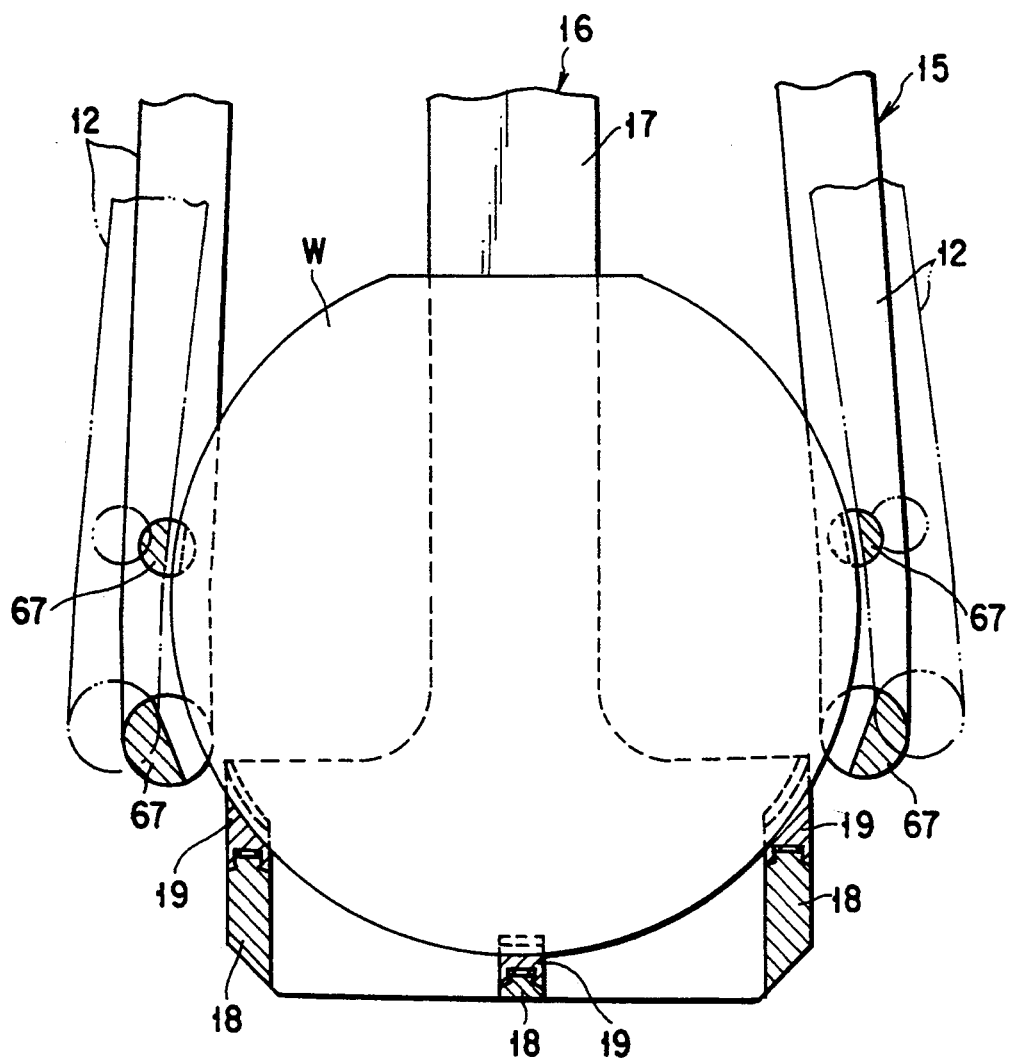
FIG. 5 is a partly-sectioned view showing a wafer-transferring mechanism (or a wafer chuck and the wafer boat)

As shown in FIG. 3, the wafer boat 16 is supported by a lifter mechanism 100 through a member 17. This lifter mechanism 100 is disclosed in U.S. Pat. No. 5,248,022. Each of wafer holder sections 16a and 16b comprises a base member 18 and receiver members 19. The crank arm member 17 is connected to the base member 18 of each of the wafer holder sections 16a and 16b. The crank arm and base members 17 and 18 are made of quartz. It is preferable that each of the receiver members 19 is made of polyetheretherketone (PEEK), of tetrafluoroethylene-perfluoroalkylvinylether copolymer (PFA), polytetrafluoroethylene (PTFE), or polychlorotrifluoroethylene (PCTFE), and more preferably made of PEEK.

Figure 6:
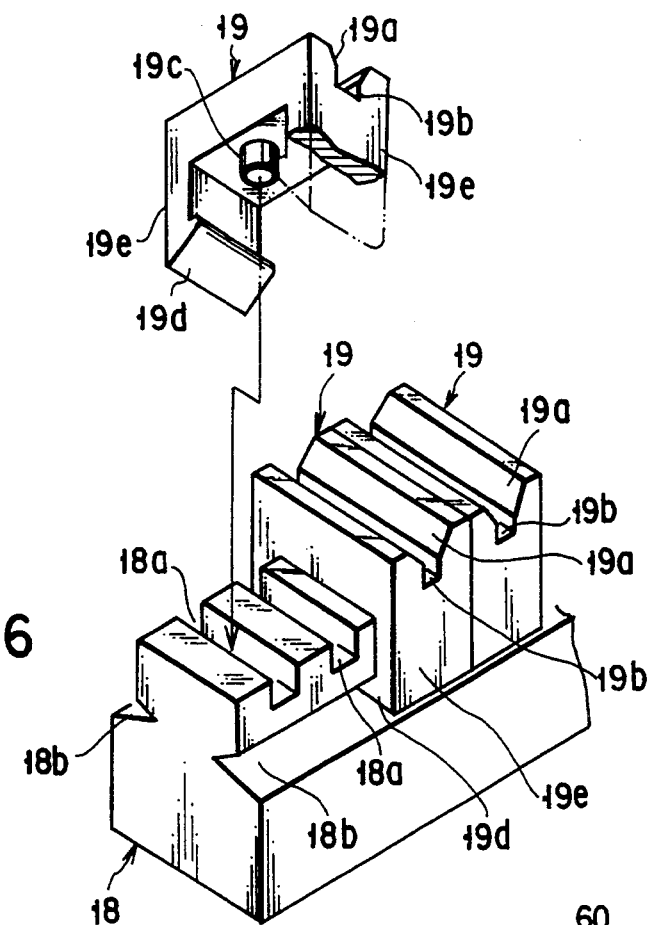
FIG. 6 is a perspective view showing a part of the wafer boat enlarged.

As shown in FIG. 6, the receiver members 19 are attached on the base member 18. A wafer-holding groove 19b is formed on each of the receiver members 19 and these grooves 19b have a certain pitch between them. Wedge-shaped grooves 18b are formed along both sides of the base member 18 and the receiver members 19 are engaged with these wedge-shaped grooves 18b.

Tapered guide faces 19a are formed along the tops both sides of each groove 19b. A fitting projection 19c is attached to the underside of each receiver member 19 which is opposed to the groove 19b thereon. This fitting projection 19c is fitted into a groove 18a of the base member 18. Legs 19e extend from both sides of the receiver member 19 and engaging claws 19d are formed at the lower ends of these legs 19e. These claws 19d are engaged with the engaged grooves 18b of the base member 18.

When the receiver members 19 are to be attached to 10 the base member 18, the projection 19c of each receiver member 19 is fitted into its corresponding groove 18a of the base member 18 and the engaging claws 19d of both legs 19e are snap-engaged with the wedge-shaped grooves 18b on both sides of the base member 18. Each of the receiver members 19 can be thus firmly attached to the base member 18 and it can be shifted in neither of the longitudinal direction of the base member 18 nor a direction perpendicular to this longitudinal direction.

Figure 7:
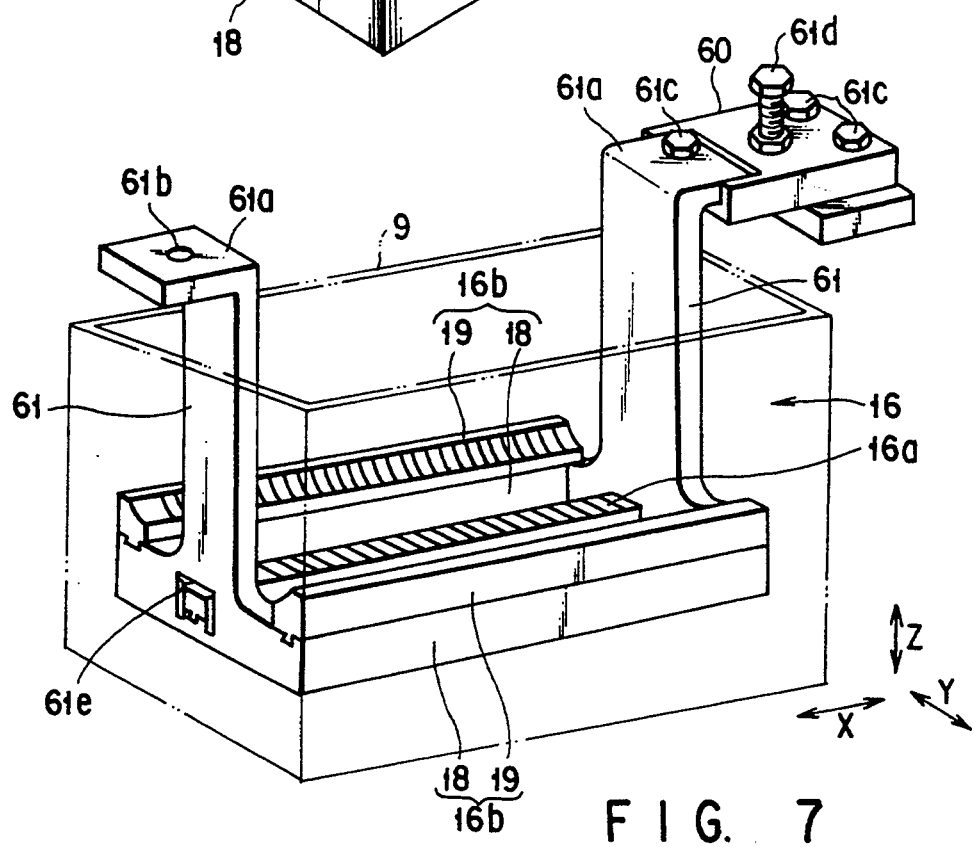
FIG. 7 is a perspective view showing the wafer boat.

As shown in FIGS. 4 and 7, the wafer holder section of the wafer boat 16 is a center member 16a and the wafer holder sections thereof are two side members 16b.

A plurality of grooves 18a and 19b are formed on each of the members 16a and 16b. A pitch Lb between the grooves 18a or between the grooves 19b is little shorter than that Lc of the chuck grooves 69b under room temperature. When the wafer boat 16 is immersed in process solution and the members 18 and 19 are warmed up, the boat groove pitch Lb becomes substantially same as the chuck groove pitch Lc.

Referring to Table 1, it will be described what relation the groove pitch of the receiver members 19 has to the process temperature.

TABLE 1

| Process Temperature | Lb (mm) | | | | |
|---|---|---|---|---|---|
| | 4.76 | 4.75 | 4.74 | 4.73 | 4.72 |
| | L1 (mm) | | | | |
| | 116.62 | 116.375 | 116.13 | 115.885 | 115.64 |
| RT | $L_2 = 116.62$ | $L_2 = 116.375$ | $L_2 = 116.13$ | $L_2 = 115.885$ | $L_2 = 115.64$ |
| $\Delta t = 0°$ C. | $L_0 = 116.62$ | $L_0 = 116.62$ | $L_0 = 116.62$ | $L_0 = 116.62$ | $L_0 = 116.62$ |
| | $\Delta 1 = 0$ | $\Delta 1 = -0.245$ | $\Delta 1 = --0.49$ | $\Delta 1 = -0.735$ | $\Delta 1 = -0.98$ |
| 60° C. | $L_2 = 117.051$ | $L_2 = 116.806$ | $L_2 = 116.56$ | $L_2 = 116.314$ | $L_2 = 116.068$ |
| $\Delta t = 37°$ C. | $L_0 = 116.62$ | $L_0 = 116.62$ | $L_0 = 116.62$ | $L_0 = 116.62$ | $L_0 = 116.62$ |
| | $\Delta 1 = 0.431$ | $\Delta 1 = 0.186$ | $\Delta 1 = -0.06$ | $\Delta 1 = -0.306$ | $\Delta 1 = -0.552$ |
| 65° C. | $L_2 = 117.11$ | $L_2 = 116.863$ | $L_2 = 116.618$ | $L_2 = 116.371$ | $L_2 = 116.126$ |
| $\Delta t = 42°$ C. | $L_0 = 116.62$ | $L_0 = 116.62$ | $L_0 = 116.62$ | $L_0 = 116.62$ | $L_0 = 116.62$ |
| | $\Delta 1 = 0.490$ | $\Delta 1 = 0.244$ | $\Delta 1 = -0.002$ | $\Delta 1 = -0.248$ | $\Delta 1 = -0.494$ |
| 80° C. | $L_2 = 117.285$ | $L_2 = 117.038$ | $L_2 = 116.791$ | $L_2 = 116.546$ | $L_2 = 116.299$ |
| $\Delta t = 57°$ C. | $L_0 = 116.62$ | $L_0 = 116.62$ | $L_0 = 116.62$ | $L_0 = 116.62$ | $L_0 = 116.62$ |
| | $\Delta 1 = 0.665$ | $\Delta 1 = 0.418$ | $\Delta 1 = 0.172$ | $\Delta 1 = -0.074$ | $\Delta 1 = -0.32$ |
| 110° C. | $L_2 = 117.635$ | $L_2 = 117.387$ | $L_2 = 117.140$ | $L_2 = 116.893$ | $L_2 = 116.646$ |
| $\Delta t = 87°$ C. | $L_0 = 116.62$ | $L_0 = 116.62$ | $L_0 = 116.62$ | $L_0 = 116.62$ | $L_0 = 116.62$ |
| | $\Delta 1 = 1.015$ | $\Delta 1 = 0.767$ | $\Delta 1 = 0.520$ | $\Delta 1 = 0.273$ | $\Delta 1 = 0.026$ |

The reference pitch Lc was set 4.76 mm and the boat groove pitch Lb was set 4.76 mm, 4.75 mm, 4.74 mm, 4.73 mm and 4.72 mm, respectively, under room temperature. The grooves of the receiver members 19 were arranged to hold 50 sheets of 8-inch wafers. Each of the receiver members 19 was made of PTFE (linear expansibility: $10 \times 10^{-5}/°C$.). The temperature was set room temperature (RT=23° C.), 60° C., 65° C., 80° C. and 110° C., respectively. Table 1 shows how the groove pitch of the receiver members 19 is changed under these various temperatures. As apparent from Table 1, the optimum groove pitch Lb at the room temperature is 4.74 mm when the process temperature is 60° C. and 65° C. It is 4.73 mm when the process temperature is 80° C., and it is 4.72 mm when the process temperature is 110° C.

$L_0$ represents a length extending from the center groove of the 50-sheet wafers holding chucks to the end groove thereof. $L_0$ is a certain value and it is taken for a reference. $L_1$ denotes a length extending from the center groove of the boat to the end groove thereof under room temperature. When the boat groove pitch Lb is 4.76 mm, for example, $L_1$ becomes 116.62 mm ($L_1 = 4.76 \times 49/2$). $L_2$ represents a length extending from the center groove of the boat to the end groove thereof under each process solution temperature, which is set 60° C., 65° C., 80° C. and 110° C., respectively. $L_2 = L_1 + L_1 \times \Delta t \times 10 \times 10^{-5}$ and $\Delta = L_2 - L_0$. As difference $\Delta 1$ becomes nearer to zero, the positional shift of the boat grooves 19b (or pitch Lb) from the chuck grooves 69b (or pitch Lc) becomes smaller under process temperature selected. It is the most desirable that the clearance between the substrate and each side of the groove in which the substrate is held is in a range of 0.1–0.125 mm. When it becomes too large, the substrate will fall sidewards an the groove as shown in FIG. 23B. When it is too small, however, the substrate is likely to be damaged. In addition, particles are likely to be caused.

As shown in FIG. 7, a position adjuster mechanism 60 is attached to the support of the boat 16. The boat 16 can be moved in a direction Z by a position adjusting bolt 61d of the position adjuster mechanism 60. A flange 61a of each holder member 61 is fixed to another member (not shown) by a fixing bolt 61c.

Figure 8:
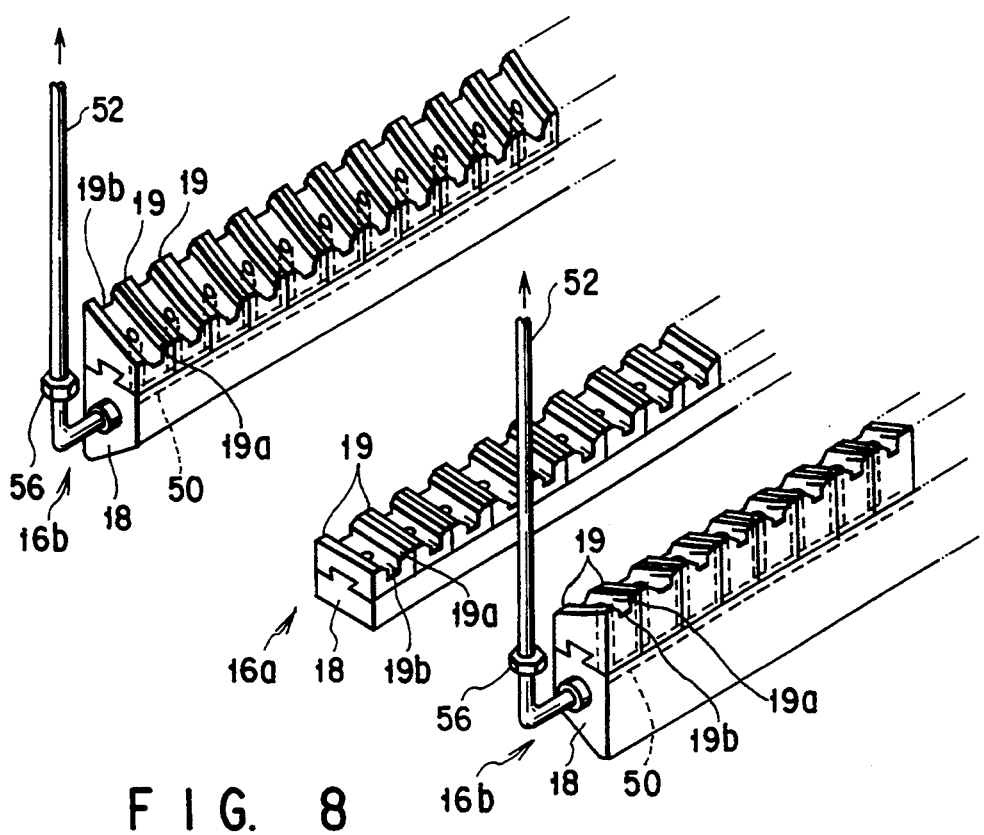
FIG. 8 is a perspective view showing parts of a wafer holder section of the boat.
Figure 9:
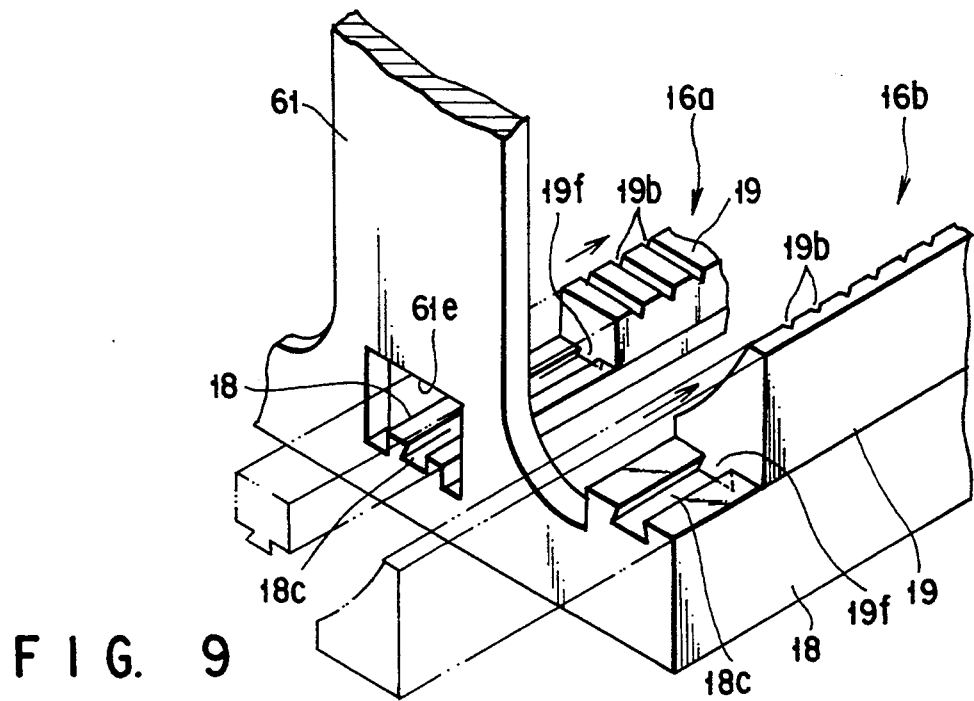
FIG. 9 is a perspective view showing a part of the wafer holder section of the boat.

As shown in FIGS. 2 and 8, an exhaust passage 50 as formed in the base member 18 of each side holder member 16b. It is opened in each of the wafer holding grooves 19b. Its base end is communicated with a suction pump 51 through a pipe 52. The suction pump 51 is arranged outside the process vessel 9 and it is communicated with a solution supply opening 9b in the bottom of the vessel 9 and also with an overflow enclosure 9c at the top portion of the vessel 9 through a circulation pipe 59. A flow rate control valve 54 and a filter 55 are arranged on the pumping (or solution supply) side of the suction pump 51. The exhaust pipe 52, smaller in diameter than the circulation pipe 53, is connected to the sucking side of the pipe 53. The exhaust and circulation pipes 52 and 53 are made of quartz. Coupling members 56 of the exhaust pipes 52 and a coupling member 57 between the exhaust pipe 52 and the circulation pipe 53 are made of the tetrafluoroethylene-perfluoroalkylvinylether copolymer (PFA), for example.

The exhaust passage 50 may be formed in the center member 16a as well as in the side members 16b. The exhaust passages 50 is not necessarily connected to the suction pump 51 of the circulation type but may be connected to the one of the other type.

When the suction pump 51 is made operative, process solution is sucked from the overflow enclosure 9c into the circulation pipe 53. After impurities are removed from the solution, it is again returned into the process vessel 9 and then rises in the process vessel 9 around each of the wafers W, while being rectified by a rectifier plate 9d. The process solution in the exhaust passages 50 flows into the circulation pipe 53 and particles in it are trapped by the filter 55 as it flows through the circulation pipe 53.

Figure 10:
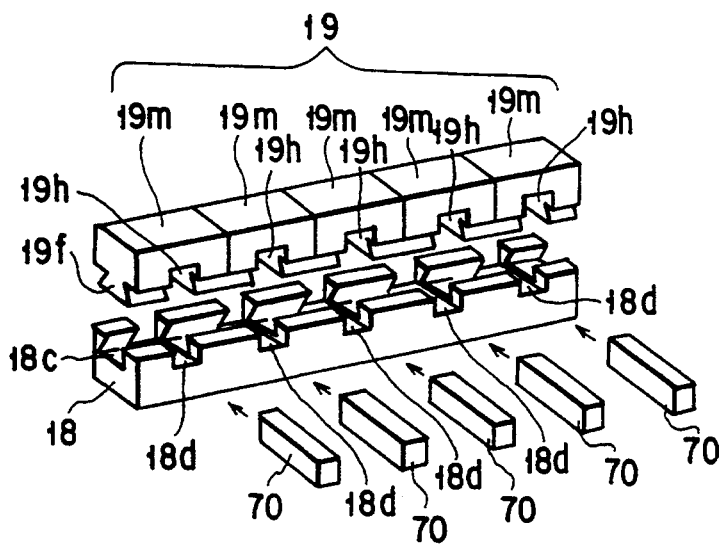
FIG. 10 is a perspective view showing wafer holder members of the boat dismantled.

As shown in FIG. 10, the receiver member 19 may be a combination of five receiver pieces 19m. An engaged groove 18c is formed on the base member 18, extending in the longitudinal direction thereof, and five key grooves 18d are also formed on the base member 18, having a same interval between them in the longitudinal direction thereof. An engaging projection 19f and a key groove 19h are formed on the underside of each receiver piece 19m. The Projections 19f are engaged with the engaged groove 18c of the base member 18, the receiver pieces 19m are slid on the base member 18 along the longitudinal direction thereof, and the key grooves 19h of the receiver pieces 19m are aligned with those 18d of the base member 18. And when keys 70 are inserted into holes which are formed by the key grooves 19h and 18d, the receiver pieces 19m are fixed in the engaged groove 18c and thus locked to the base member 18.

Figure 11:
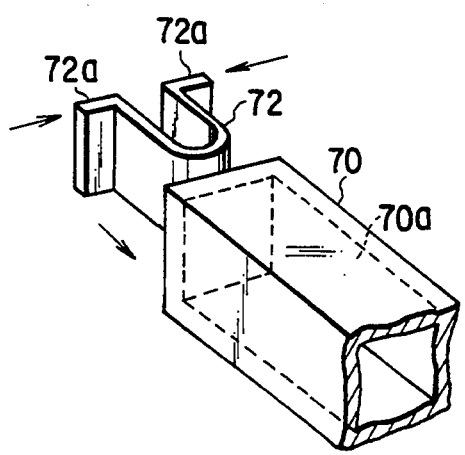
FIG. 11 is a perspective view showing a key member and a stopper.
Figure 12:
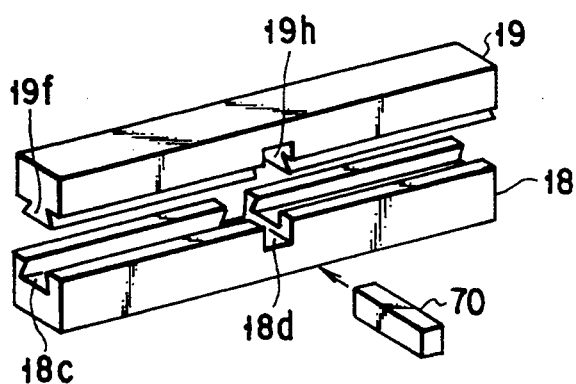
FIG. 12 is a perspective view showing wafer holder members of another wafer boat dismantled.
Figure 13:
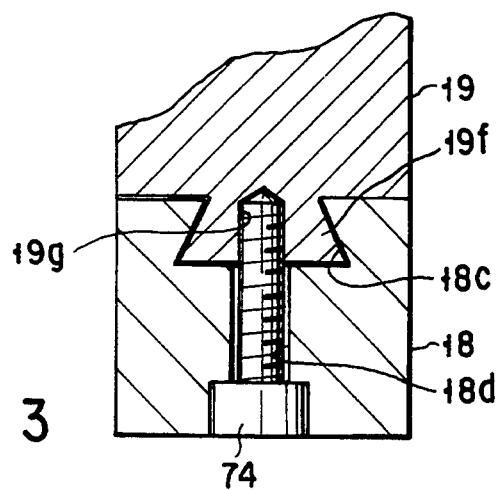
FIG. 13 is a partly-sectioned view showing the wafer holder members of another wafer boat.

As shown in FIG. 11, an end of each key 70 is made hollow and a stopper 72 is inserted into this hollow end 72a of each key 70. The stopper 72 is so flexible as to be easily deformed when its flanges 72a are pressed by fingers. When the stoppers 72 are inserted into the hollow ends 70a of the keys 70, therefore, the keys 70 can be firmly held in the holes formed by the key grooves 18d and 19f. The keys 70 and stoppers 72 are made of resin such as PEEK, PFA, PTFE or PCTFE. The key 70 and stopper 72 are formed integral. As shown in FIG. 12, it may be arranged that the receiver member 19 is formed as a piece and that this one piece receiver member 19 is locked to the base member 18 by one key 70. As shown in FIG. 13, a screw 74 may be used instead of the key 70. When the screw 7a is screwed into a screw hole 19g of the receiver member 19 through a hole 18d of the base member 18, the receiver member 19 can be locked to the base member 18 in this case. The screw 74 is made of PTFE, polychlorotrifluoroethylene (PCTFE), PEEK or quartz.

The fitting projection 19c is not necessarily shaped like a column but it may be shaped like a square pole or a rectangle to be fitted into its corresponding groove 18a. When the adjacent receiver pieces 19m have a clearance between them, their working errors and thermal expansive deformation can be absorbed.

According to the above-described embodiment, the receiver members 19 are made of PEEK. This enables particles, which are caused in the wafer-holding grooves 19b of the receiver members 19, to be reduced.

The wafer chucks 12 will be described referring FIGS. 14 and 15.

Each support rod 67 can also be formed by a base member 68 and a receiver member 69 in the case of the wafer chucks 12. A fitted groove 68c is formed on the base member 68 along the longitudinal direction thereof and a fitting projection 69f of the receiver member 69 is fitted into the fitted groove 68c of the base member 68. Window holes 61e are formed in both arms 12a and both ends of the receiver member 69 are inserted into the window holes 61e of the arms 12a in this case. The receiver member 69 is fixed to the base member 68 by a screw 62, as seen in FIG. 13.

Means for detecting wafers W in the process vessel 9 will be described with reference to FIGS. 4, 16 and 17.

Detector means 21 is attached to the process vessel 9 to detect whether or not wafers W are present in the vessel 9. The detector means 21 is a photoelectric sensor of the permeable type having a light emitting element 22 and a light receiving element 23. The light emitting element 22 is attached to one side 9a of the vessel 9 and the light receiving element 23 to the other side 9a thereof. They are opposed to each other. When fluorine acid is used as process solution, the sides 9a of the process vessel 9 are made of PTFE. However, beam light emitted from the light emitting element 22 cannot penetrate the PTFE-made sides of the vessel 9 because PTFE is opaque.

Figures 16, 17:
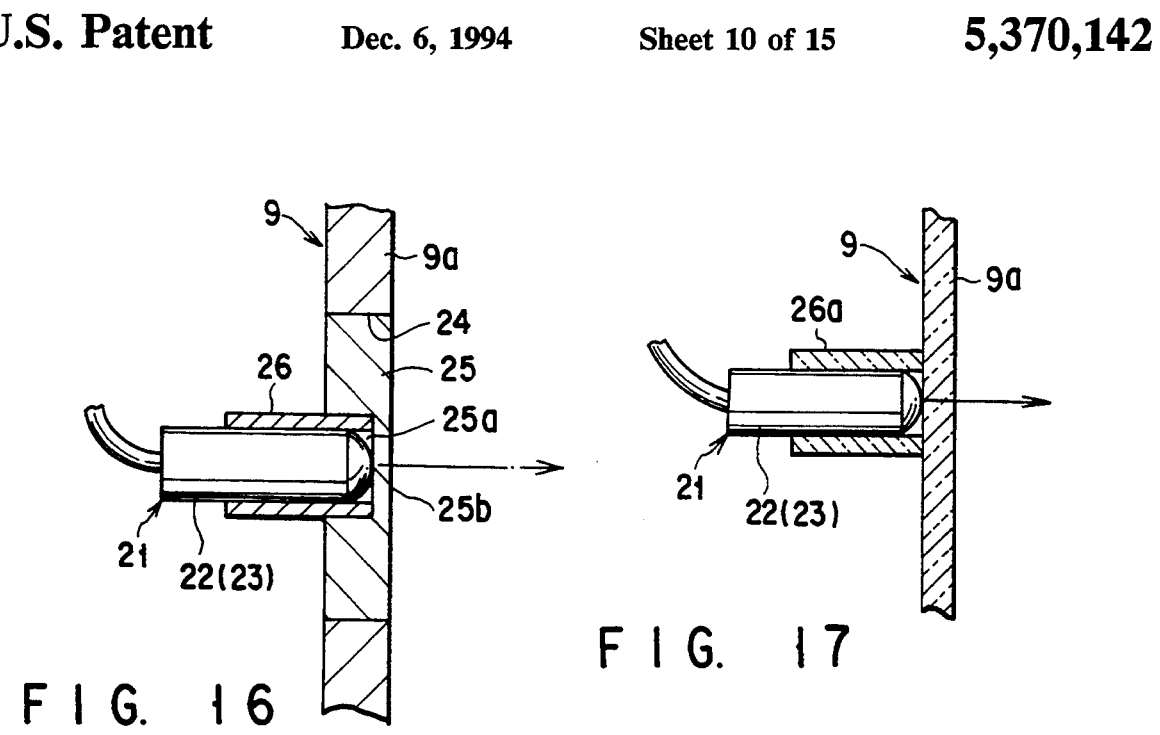
FIG. 16 is a sectional view showing a wafer detecting sensor.
FIG. 17 is a sectional view showing another wafer detecting sensor.

As shown in FIG. 16, therefore, the sensor element 22 (and 23) is attached into a PFA-made plate 25, which is a part of the side 9a of the vessel 9, to emit beam light through a thin part 25b of the plate 25. Because PFA can be welded with PTFE, the plate 25 can be fixed to the side 9a of the vessel 9 by welding after it is fitted into a window hole 24 of the side 9a. More particularly, a recess 25a is formed in the outer face of the plate 25, having the thin part 25b of about 2–4 mm. A support sleeve 26 is inserted into the recess 25a and the sensor element 22 (and 23) is inserted into the support sleeve 26. The support sleeve 26 is made of PFA and fixed to the plate 25 by welding. Beam light emitted from the light emitting element 22 passes through the thin part 25b of the plate 25 and then through solution in the vessel 9 and it is received by the light receiving element 23, when wafers W are present in the vessel, beam light is shielded by the wafers W and the presence of the wafers W in the vessel 9 can be thus detected.

When the process vessel 9 is made of quartz, a support sleeve 26a is attached to the outer face of the side 9a and the light emitting element 22 is inserted into the support sleeve 26a, as shown in FIG. 17. Light can penetrate through quartz and it can be therefore detected whether or not any wafer is present in the vessel 9.

Figure 18:
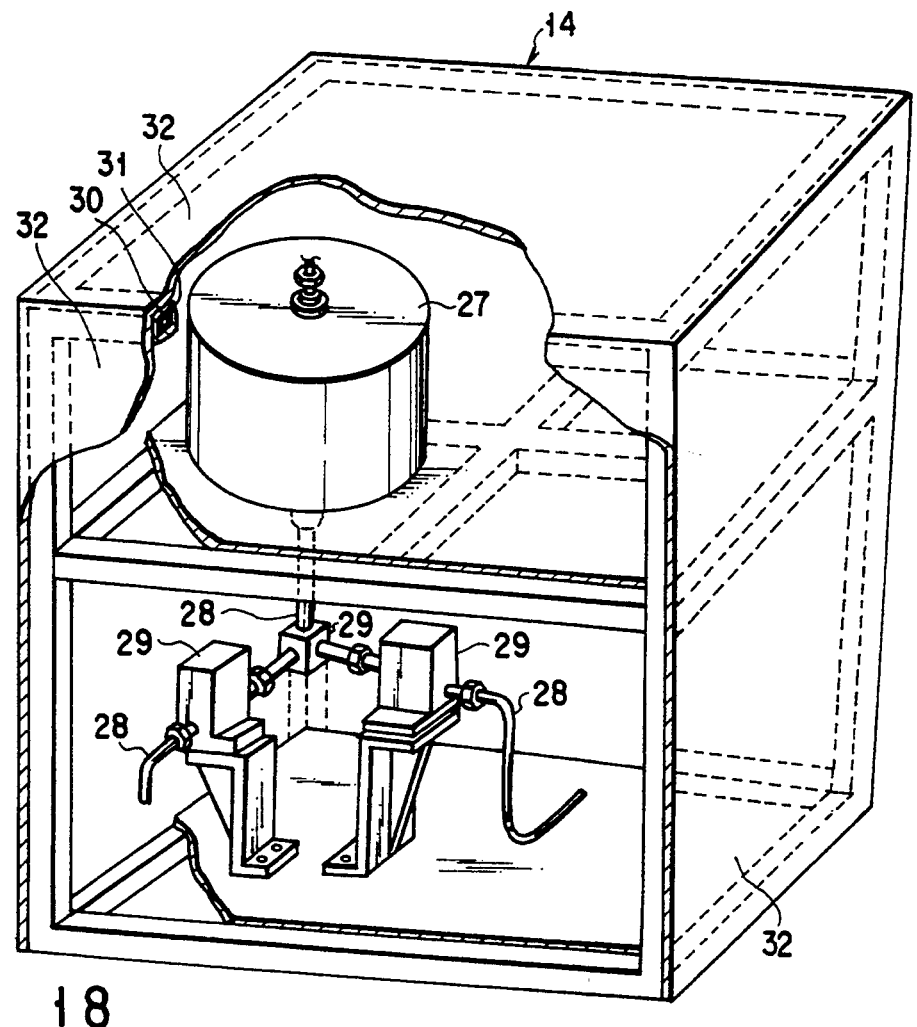
FIG. 18 is a perspective view showing a boxing in which a pipe arrangement for solution is housed, partly cut away.
Figure 19:
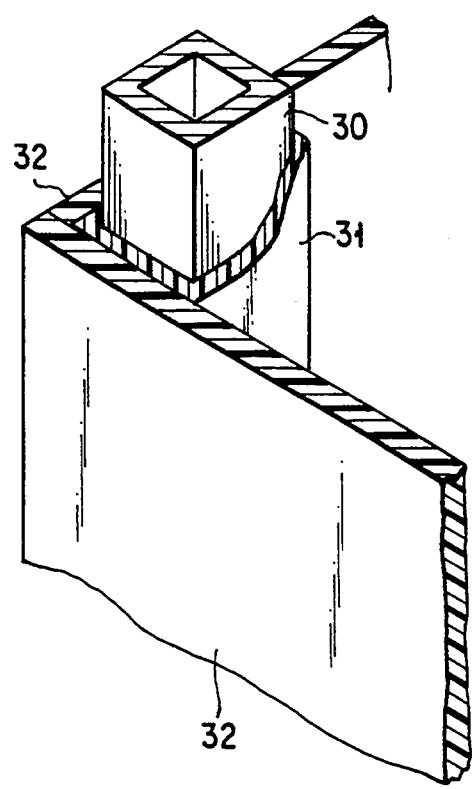
FIG. 19 is a perspective view showing the pipe arrangement-housed box partly sectioned.

A solution tank 27, pipes 28 and valves 29 are housed in the room 14, as shown in FIG. 18. These pipes 28 and valves 29 serve to supply process solution in the solution tank 27 into the process vessel 9. When the room 14 is made as a unit box in this case, the sealing capacity and the maintaining easiness of the room 14 can be enhanced. However, the strength of the room 14 must be considered together with its resistivity to process solution. As shown in FIG. 19, therefore, a frame 30 made of stainless steel is covered by a plate 31 of polyvinyl chloride (PVC) and this PVC-made plate 31 is fixed to PVC-made panels 32 by welding.

Figure 20:
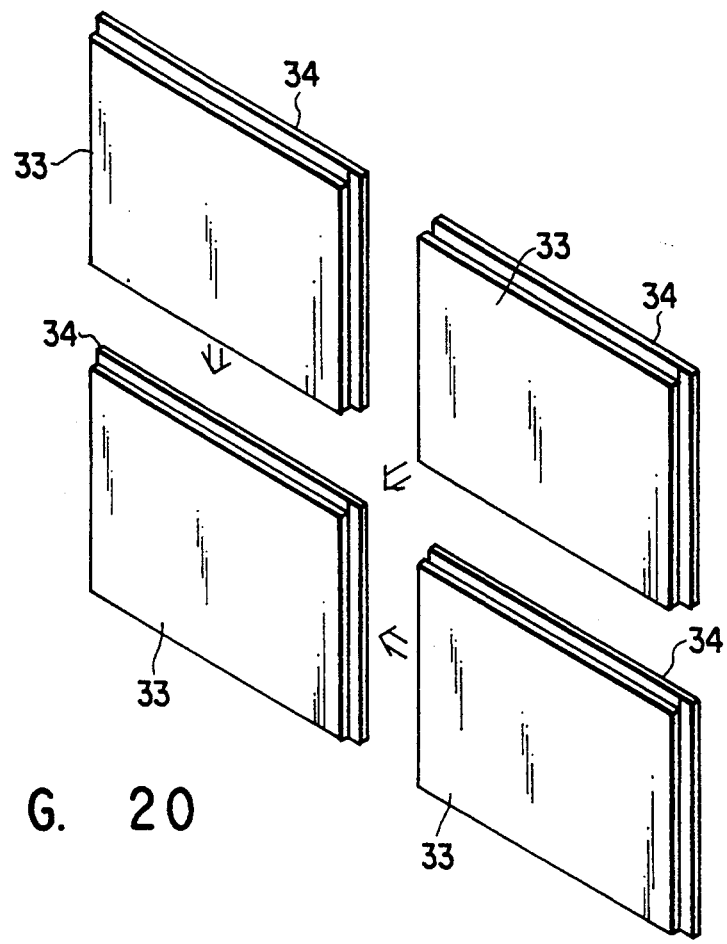
FIG. 20 is a perspective view showing outer covers of a wafers-cleaning section dismantled.

As shown in FIG. 20, the cleaning area 2 is enclosed by plural PVC-made panels 33 to shield the inside of this area 2 from atmosphere. Each panel 33 has thin flanges 34 along its rims and when these thin flanges 34 of one panel 33 are jointed to those of the other panels 33, it can be made difficult for process solution and gas to leak through these jointed portions of the panels 33.

A pusher mechanism 40 is arranged in the loader section 5, as shown in FIG. 21. It serves to push wafers W from the cassette (not shown). When only silicon wafers W are to be cleaned, each of grooves 40a of a receiver member of the pusher mechanism 40 may be set to have a width suitable for the thickness of the silicon wafer W. However, the glass substrate GS is thicker than the silicon wafer W. The pusher mechanism 40 cannot be therefore used for both of them.

Figure 22:
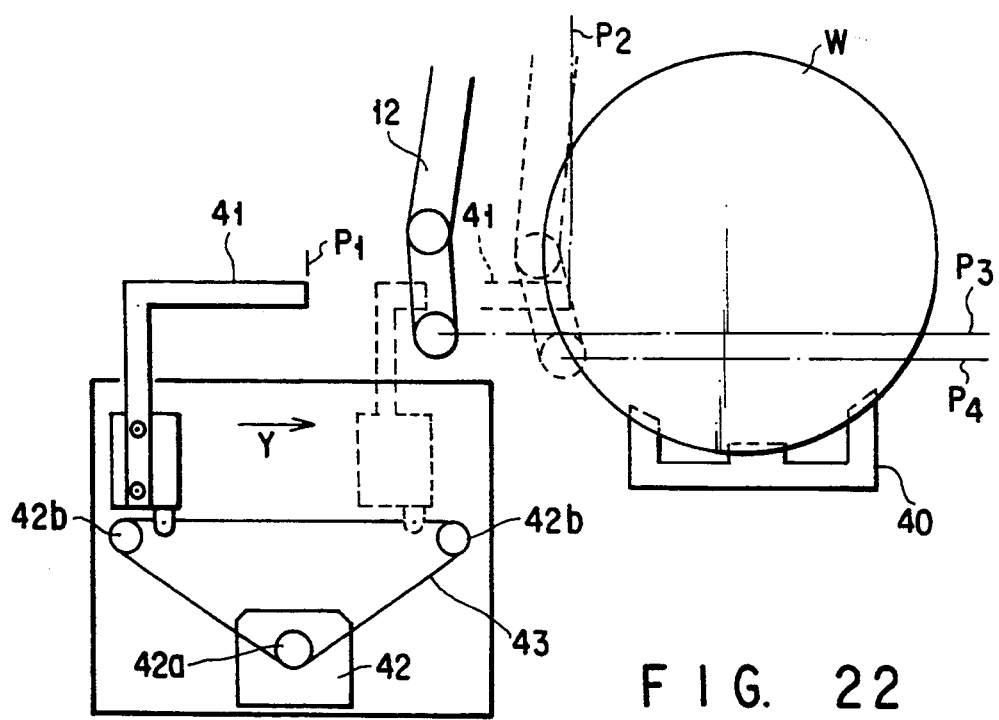
FIG. 22 is intended to describe how the wafer chuck mechanism is operated.
Figure 23A:
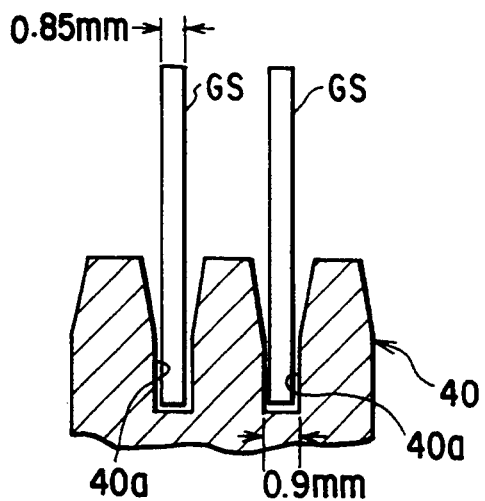
FIG. 23A is a sectional view showing the pusher mechanism for glass substrates.
Figure 23B:
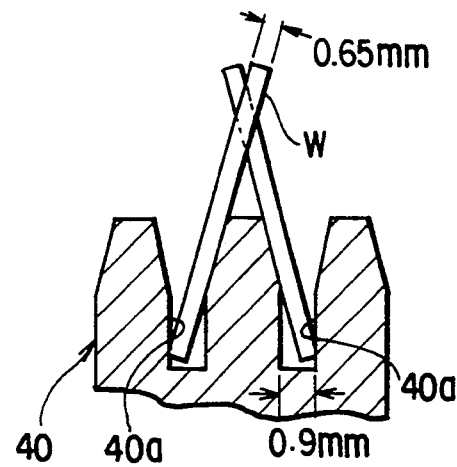
FIG. 23B is a sectional view showing the pusher mechanism for wafers.

When the width of each groove 40a of the pusher mechanism 40 is set suitable for the glass substrate GS, as shown in FIG. 23A, the silicon wafers W will fall sidewards in the grooves 40a, as shown in FIG. 23B. Auxiliary mechanisms 41 are therefore arranged on both sides of the pusher mechanism 40, as shown in FIGS. 21 and 22, to hold the wafers W between them when the wafers W are pushed by the pusher mechanism 40.

As shown in FIG. 22, the auxiliary mechanism 41 is connected to a timing belt 43 which is stretched round a motor shaft 42a and pulleys 42b. When a stepping motor 42 is driven, the timing belt 43 runs to move the auxiliary mechanism 41 in a direction Y.

The operation of each auxiliary mechanism 41 will be described. The auxiliary mechanism 41 is waiting at its home position $P_1$. Each wafer chuck 12 is moved to a position $P_3$ by the wafer carrier means 15 and the auxiliary mechanism 41 is then moved to a position $P_2$. Thereafter, the wafers W are pushed out of the cassette by the pusher mechanism 40. They are held this time by the auxiliary mechanisms 41. This prevents them from falling sidewards in the grooves 40a. When they are pushed to a predetermined position, the wafer chucks 12 are moved to a position $P_4$ to hold the wafers W between them. The auxiliary mechanisms 41 are then returned to their home positions $P_1$ and the wafer chucks 12 are moved upwards while holding the wafers W between them. When these auxiliary mechanisms 41 are used, both of the glass substrates GS and the silicon wafers W can be transferred to the wafer chucks 12 by the same pusher mechanism 40.

Figure 24:
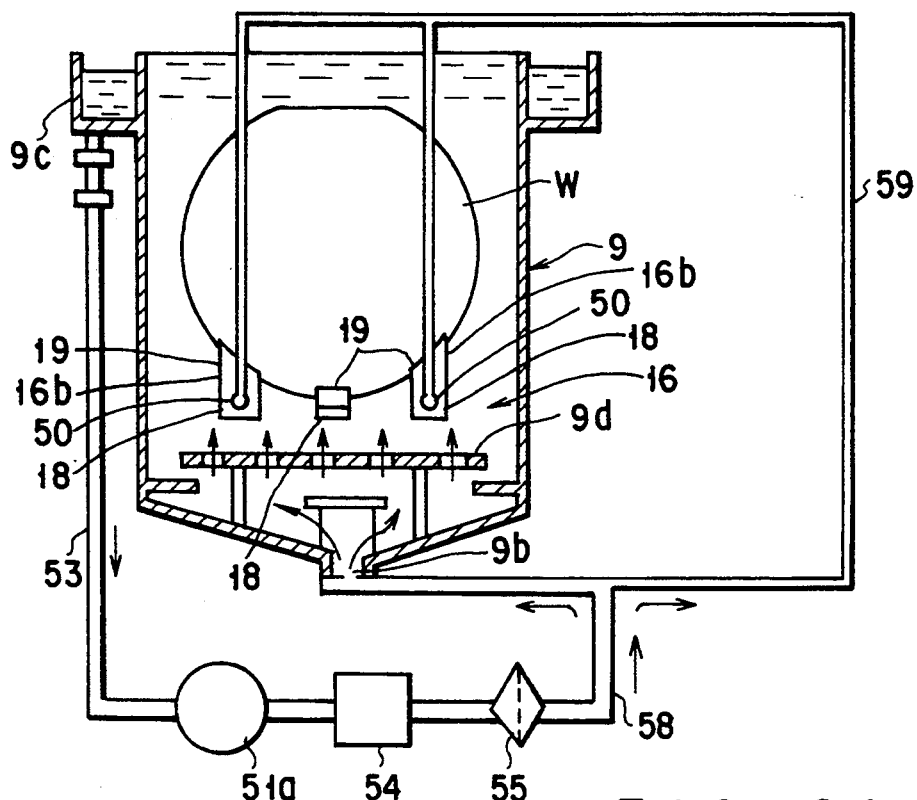
FIG. 24 is a perspective view showing a solution circulation of another wafer-cleaning apparatus.
Figure 25:
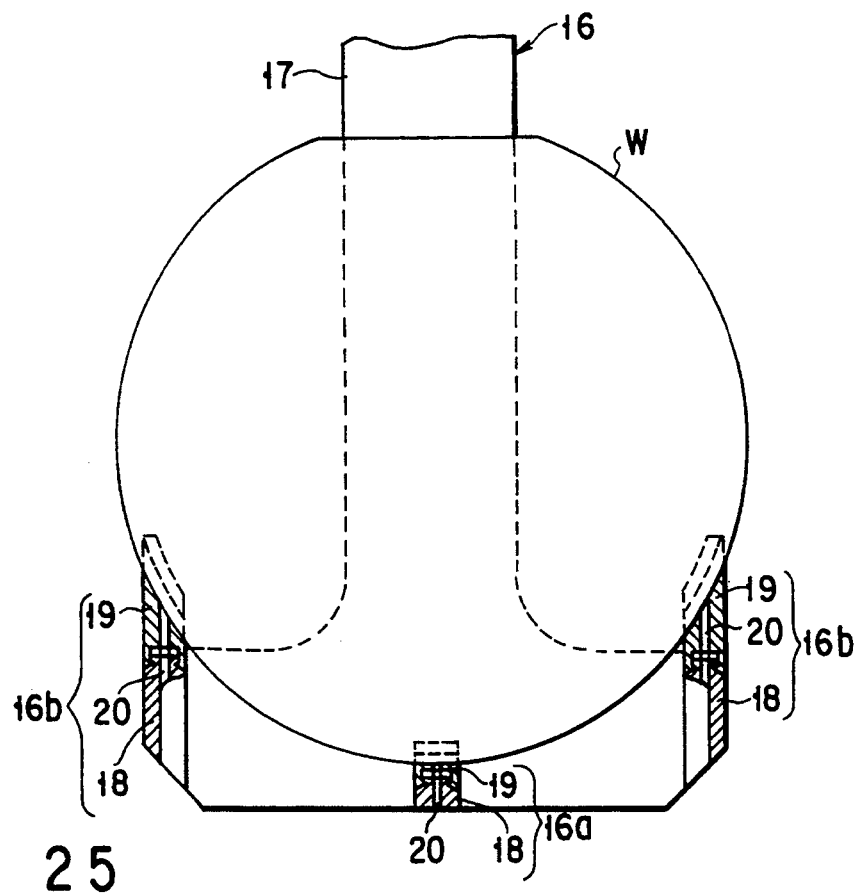
FIG. 25 is a vertically-sectioned view showing a wafer holder section of the boat of another waferscleaning apparatus.
Figure 27:
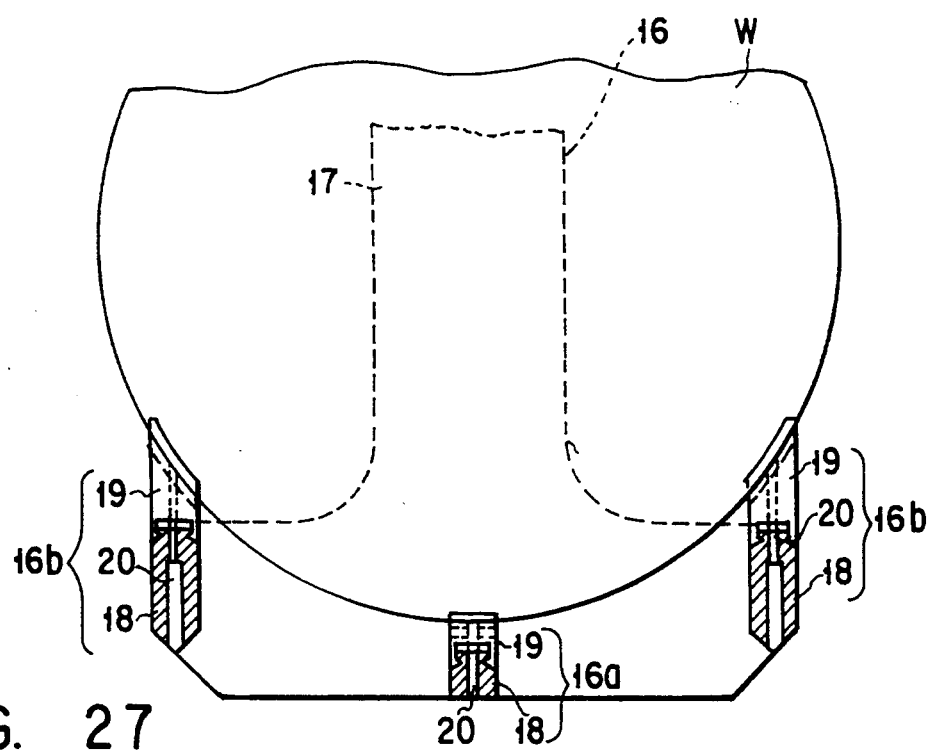
FIG. 27 is a vertically-sectioned view showing a wafer holder section of the boat of a further waferscleaning apparatus.
Figure 26:
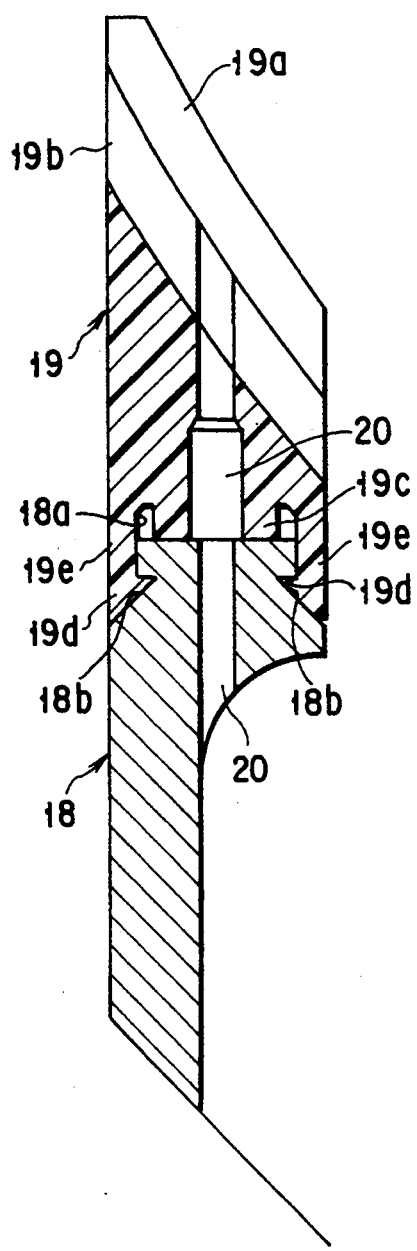
FIG. 26 is a vertically-sectioned view showing one of wafer holder members on both sides of the boat.
Figure 28:
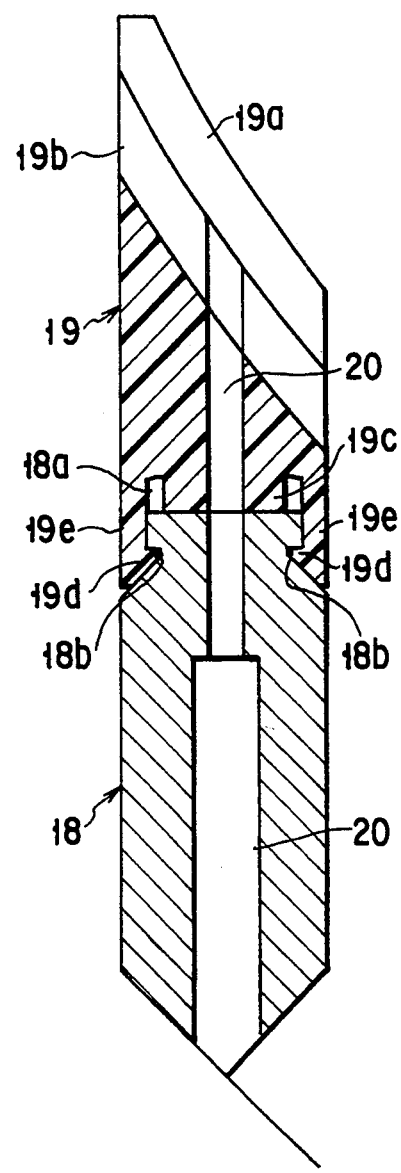
FIG. 28 is a vertically-sectioned view showing one of wafer holder members on both sides of the boat.

Another embodiment of the present invention will be described referring to FIG. 24.

A pipe 59 is communicated with passages 50 in the side base members 18. It branches from a pipe 58 arranged an the pumping side of a pump 51a. The other branching from the same pipe 58 is connected to the solution supply opening 9a of the process vessel 9. The flow rate adjuster valve 54 and the filter 55 are arranged in the pipe 58 arranged on the pumping side of the pump 51a. The sucking side of the pump 51a is communicated with the overflow enclosure 9c through the pipe 53.

When the washing apparatus is arranged in this manner, a part of process solution flows into the exhaust passages 50 and it is pumped out in the wafer holding grooves 19b. Particles in the grooves 19b can be thus removed from the grooves 19b by this flow of pumped-out solution. The flow in which particles are included flows into the filter 55, passing through the overflow enclosure 9c and the circulation pipe 53, so that particles can be removed from the solution by the filter 55.

A further wafer holder section will be described referring to FIGS. 25 through 28.

The area of each wafer W which is contacted with the wafer holder sections 16a and 16b is made smaller in this case to more reliably remove particles from the wafer W. Exhaust passages 20 are formed in each of the wafer holder sections 16a and 16b. The receiver member 19 is made of synthetic resin and formed as a unit integral to the base member 18. Each of the exhaust passages 20 passes through the base and receiver members 18 and 19 and it is opened in each of the wafer holding grooves 19b. This opening in each of the wafer holding grooves 19b makes smaller the area of each wafer a which is contacted with its corresponding wafer holding groove 19b. In addition, process solution remaining in the wafer holding grooves 19b can be more easily removed. Further, solution can fall and release more easily from each base member 18 because a cut-away portion is formed at the lower portion of the base member 18.

Although the washing apparatus according to the present invention has been used to clean the semiconductor wafers, it can also be used to wash glass, LCD and other substrates.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A substrate washing device comprising:
   process vessels in which washing solutions are contained;
   chuck means having a first holder section for carrying substrate made of a first material to the process vessels while holding the substrate; and
   boat means having a second holder section for receiving the substrates from the chuck means and for supporting the substrate in the washing solutions;
   wherein said second holder section comprises base members made of erosion and heat resistant material, and receiver members attached to the base members, having a plurality of substrate holding grooves thereon, and made of a second material substantially same in softness as or softer than the first material.

2. The device apparatus according to claim 1, further comprising pump means, and exhaust passages communicated with said pump means and opened in the grooves of the receiver members, passing through the base members.

3. The device according to claim 1, further comprising exhaust passages communicated with the grooves of the receiver members, and sucking or pumping means communicated with the exhaust passages and arranged outside the process vessel.

4. The device according to claim 1, wherein the pitch of the grooves on the receiver members is changed depending upon temperatures at which the washing solution is used.

5. The device according to claim 1, wherein the pitch of the grooves on the receiver members is made smaller than that of the substrates held by the chuck means under room temperature.

6. The device according to claim 1, wherein the receiver members are slidably fitted into the base members.

7. The device according to claim 6, further comprising key grooves formed on both of the receiver and base members, and key members inserted into said key grooves to lock the receiver member to the base member.

8. The device according to claim 6, further comprising a screw for fixing the receiver member to the base member.

9. The device according to claim 1, wherein said first substrate holder section comprises base members made of erosion and heat resistant material, and receiver members attached to the base members, having a plurality of substrate holding grooves thereon, and made of the second material substantially same in softness as or softer than the first material.

10. The device according to claim 1, further comprising means for aligning the chuck means with the boat means.

11. The device according to claim 1, wherein the receiver members are made of fluorine system resin.

12. The device according to claim 1, wherein the receiver members are made of polyetheretherketone.

13. The device according to claim 1, wherein the receiver members are made of polychlorotrifluoroethylene or polytetrafluoroethylene.

14. The device according to claim 1, wherein the substrate is made of silicon.

15. The device according to claim 1, wherein the substrate is made of soda-lime glass.

* * * * *